(12) United States Patent
Kulidjian et al.

(10) Patent No.: US 6,366,864 B1
(45) Date of Patent: Apr. 2, 2002

(54) ADAPTIVE SAMPLING RATE BASED ON POWER SYSTEM FREQUENCY

(75) Inventors: Ara Kulidjian; Roger Moore, both of Toronto (CA)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/305,293

(22) Filed: May 5, 1999

(51) Int. Cl.$^7$ .............................................. G01R 21/00
(52) U.S. Cl. ..................... 702/60; 361/86; 361/93.2; 370/248; 600/443; 700/293; 702/59; 702/75; 702/77
(58) Field of Search ............................ 702/59, 60, 62, 702/64, 65, 66, 71, 75, 79; 361/1, 62, 78, 80, 184, 206, 93, 94, 95, 96; 324/74, 140

(56) References Cited

U.S. PATENT DOCUMENTS

| | | | | |
|---|---|---|---|---|
| 4,015,206 A | * | 3/1977 | Huntley ........................ 325/2 |
| 4,063,549 A | * | 12/1977 | Beretsky et al. ............... 128/2 |
| 4,630,228 A | * | 12/1986 | Tarczy-Hornoch et al. . 364/576 |
| 5,224,011 A | * | 6/1993 | Yalla et al. .................... 361/93 |
| 5,428,553 A | * | 6/1995 | Chiba et al. ................. 364/492 |
| 5,671,112 A | | 9/1997 | Hu et al. ........................ 361/86 |
| 5,721,689 A | | 2/1998 | Hart et al. .................... 364/484 |
| 5,805,395 A | | 9/1998 | Hu et al. ........................ 361/21 |
| 5,832,413 A | | 11/1998 | Benco et al. ................. 702/77 |
| 5,832,414 A | | 11/1998 | Hart et al. ..................... 702/77 |

OTHER PUBLICATIONS

Patent Abstracts of Japan, vol. 016, No. 011 (E–1153), Jan. 13, 1992 & JP 03 230722 a (MEIDENSHA CORP), Oct. 14, 1991abstract.

Patent Abstracts of Japan, vol. 016, No. 263 (E–1216), Jun. 15, 1992 & JP 04 058714 A (MITSUBISHI ELECTRIC CORP), Feb. 25, 1992 abstract.

Benmouyal G., "An Adaptive Sampling–Interval Generator for Digital Relaying", IEEE Transactions on Power Delivery, US, IEEE Inc., New York, vol. 4, No. 3, Jul. 1, 1989, pp. 1602–1609, XP000035925, ISSN: 0885–8977, abstract.

* cited by examiner

*Primary Examiner*—Arthur T. Grimley
*Assistant Examiner*—John Le
(74) *Attorney, Agent, or Firm*—Hunton & Williams

(57) ABSTRACT

A method and system for synchronizing the sampling frequency, at which power system data is sampled, with the frequency of the power system. Adjustments to the sampling frequency can be made by comparing first and second derivatives to threshold values.

16 Claims, 6 Drawing Sheets

|  | Transients or Noise | Normal Load | Severe Overload | Generator Startup or Load Rejection |
|---|---|---|---|---|
| Minimum | 0 Hz | Nominal - 1 Hz | Nominal - 10 Hz | 2 Hz |
| Maximum | Infinite | Nominal + 1 Hz | Nominal | 1.5 x Nominal |
| Direction | Any | Any | Decrease | Increase |
| Rate | Fast | Slow | < 10 Hz/s | < 20 Hz/s |
| Behavior | Random | Random | Trend | Trend |

FIG. 1

ADAPTIVE SAMPLING RATE BASED ON POWER SYSTEM FREQUENCY

BACKGROUND OF THE INVENTION

The present invention generally relates to the synchronization of sampling rates and system frequency for the analysis of system parameters. More particularly, the present invention relates to synchronizing the sampling rate of an electrical power distribution system to the frequency of the power system.

Protection devices for power systems and equipment typically operate according to protection algorithms based on Fourier analysis of sampled currents and voltages. One possible protection scheme captures instantaneous values, or samples, of power system currents and voltages 64 times per power system cycle, and performs a short term Fourier transform (STFT) on the samples. The calculations are updated in real time every 8 sample periods.

The accuracy of the Fourier algorithm is closely related to the degree of synchronization between the sampling rate and the power system frequency. However, the frequency of the power system is dynamic. For example, under normal load conditions, the frequency of the power system can deviate from a nominal value (e.g., 60 Hz in North America, 50 Hz in Europe and elsewhere) by up to 1 Hz. Under severe overload conditions, when protection is critical, the frequency can drop below nominal by as much as 10 Hz in as little as one second. Upon generator startup, the frequency can ramp up from 0 Hz to the nominal value in less than three seconds. During sudden load rejection, the frequency can overshoot the nominal value by as much as 1.5 times the nominal value. To maintain the accuracy of the Fourier transform calculations, and therefore the reliability of the protection, it is highly desirable to adjust the sampling rate.

Known techniques for adjusting power system sampling rates rely on generating a filtered and squared version of a power system voltage signal, measuring the frequency by counting the zero crossings of the current and voltage signals, and averaging the number of zero crossings over the number of power system cycles. However, such techniques are not sufficiently accurate for a variety of reasons. For example, a current reversal (i.e., where a substantially sinusoidal curve reverses itself just prior to a zero crossing) essentially incurs a ½ period delay and can be incorrectly diagnosed by a zero-crossing algorithm as an underfrequency condition. Further, transients and phase shifts can cause "false" zero-crossings. In addition, the filtering and squaring circuitry for detecting zero-crossings can introduce noise into the signal in the form of jitter, resulting in additional error. Another shortcoming of techniques that rely on averaging is that the averaging calculation tends to result in a relatively slow synchronization performance.

U.S. Pat. Nos. 5,832,414, 5,832,413, and 5,721,689 disclose a generator protection system and method for phasor estimation and frequency tracking in digital protection systems. The method uses a variable N-point discrete Fourier transform (DFT) to compute phasors based on data acquired from sampled signals. At each sampling interval, the change in phasor angle between the current and previous phasor angles is used to estimate the instantaneous frequency of the signal. Instantaneous frequencies are averaged over a cycle of the signal to generate an average cycle frequency. In addition, a number of discrete frequencies and corresponding DFT windows based on a fixed sampling rate and a predetermined fundamental frequency of the signal are defined and used in estimating the instantaneous frequency. Once the average cycle frequency is determined, the DFT window is adjusted by setting it equal to the DFT window corresponding to the discrete frequency closest to the average cycle frequency. These patents do not adequately address the previously-discussed problems.

U.S. Pat. Nos. 5,671,112 and 5,805,395 disclose systems for implementing accurate V/Hz value measurement and trip time determination for generator/transformer overexcitation protection independent of the conventional frequency tracking and phasor estimation based on DFT techniques. According to the '112 patent, a sampled sinusoidal voltage signal is passed through a digital integrator and the magnitude of the integrator output is measured as representative of the V/Hz ratio. The digital integrator is implemented in software using a difference equation in a generator protection unit. When the sampling frequency is variable, the filter coefficients of the digital integrator are recalculated each time the sampling frequency is changed, and a new value for the peak magnitude of the output of the digital integrator is calculated using the recalculated filter coefficients.

According to the '395 patent, a non-recursive digital technique is used which measures the per unit V/Hz value by summing sampled data points every half-cycle of a sinusoidal input signal, and by dividing the sum with an ideal base value sum. When the input voltage signal is sampled at a reasonable frequency, the disclosed technique approximates the per unit V/Hz value of the input voltage signal without computing voltage and frequency separately. The '112 and '395 patents likewise do not adequately address the problems described above.

SUMMARY OF THE INVENTION

In view of the above discussion, it would be highly desirable to improve the synchronization of the sampling rate of a power system protection device to the power system frequency. It would further be desirable to be able to discriminate between transients and real frequency events, so that transients do not adversely affect the sampling rate while real frequency events will be correctly factored in to adjusting the sampling rate. The present invention overcomes the problems of the prior art and provides additional advantages, by providing for a technique for adjusting the sampling rate of a power system protection device. According to exemplary embodiments, a method for adapting a sampling rate to the frequency of an electrical power system includes the steps of: performing a first frequency calculation; determining first and second derivatives of the frequency of the electrical power system; determining a normal first derivative, a maximum first derivative value and a maximum second derivative value from power system characteristics; comparing the first and second derivatives to the first and second maximum derivative values, respectively, and comparing the first derivative to the normal first derivative; and if the first derivative is less than the normal first derivative, or if both the first and second derivatives are lower than the first and second maximum derivatives, then accepting the first frequency calculation as true, and adapting the sampling rate based on the first frequency calculation.

Techniques implementing the present invention provide greatly improved synchronization, speed, accuracy, and hence protection, over known techniques.

BRIEF DESCRIPTION OF THE DRAWINGS

The present invention and its resulting advantages can be more fully understood by reading the following Detailed Description in conjunction with the accompanying drawings, in which:

FIG. 1 is a table outlining characteristics of various events in a power system which are of concern for implementing a technique according to the present invention;

DETAILED DESCRIPTION

Referring now to FIG. 1, a table representative of various power system characteristics of interest for implementing the present invention. The table identifies the minimum and maximum limits, direction of change, rate of change, and behavior of change for transients/noise, as compared to real frequency events such as normal load, severe overload, and generator startup or load rejection. Since the input of interest (power system frequency) is a single quantity in time, most of the characteristics of interest are related to changes of the quantity. It will be apparent from the table that the real frequency events are characterized by a relatively slow change in period, or by a relatively fast change in period but having a recognizable trend in one direction (e.g., increasing or decreasing). These characteristics can be used, according to an aspect of the present invention, to distinguish the real frequency events from transients or noise, which can be characterized by relatively fast, erratic (i.e., demonstrating no readily recognizable trend) changes in period.

Figure 2:
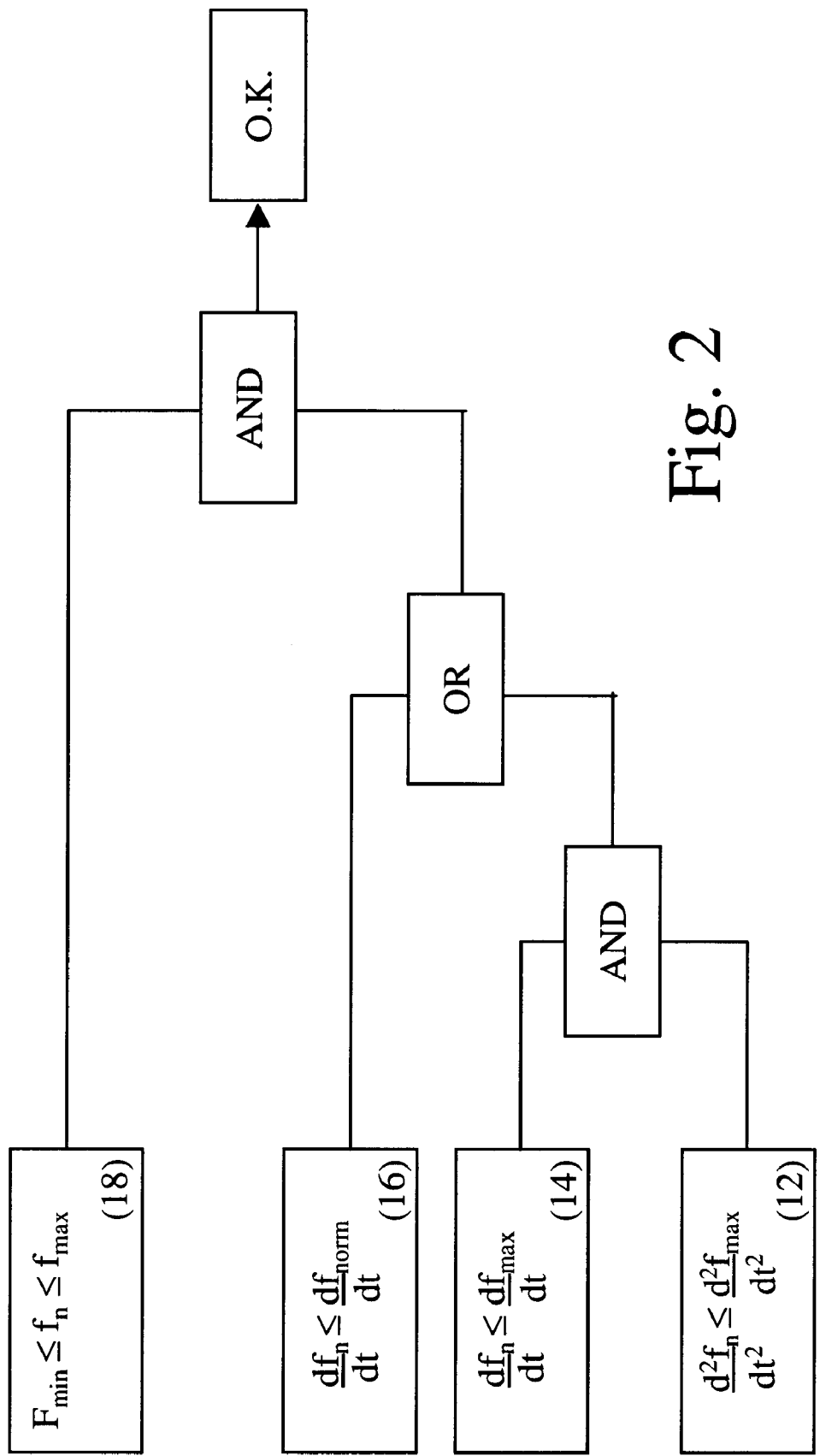
FIG. 2 is a logic diagram representative of one implementation of the present invention.

Referring now to FIG. 2, a logic diagram representing an exemplary implementation of the present invention is shown. In this example, it is assumed that a protective relay or other device for the monitoring or protective control of a power system is provided with a microprocessor, programmable logic, circuitry, or other suitable means for performing comparisons of various power system data. In FIG. 2, it is further assumed that $T_n$ is an n-th period measurement, $f_n=1/T_n$ and is an n-th frequency calculation, $df_n/dt=(f_n-f_{n-1})T_n$, and is an n-th frequency rate calculation, and $|d^2f_n/dt^2|=[(df_n/dt)-(df_n/dt)]/T_n$, and is an n-th frequency acceleration calculation. Further, to implement the logic scheme of FIG. 2, maximum frequency values ($f_{min}$ and $f_{max}$) are determined for all frequency events; maximum frequency rate values ($|df/dt|_{norm}$ and $|df/dt_{max}|$) are determined for the maximum frequency change rate under normal load conditions and for any frequency event, respectively; and a maximum frequency acceleration value $|d^2f_n/dt^2|_{max}$, is determined for all frequency events. Using these values, the logic scheme of FIG. 2 can be described as follows: a logical AND operation is performed to determine if both the n-th frequency rate calculation ($|df_n/dt|$) is less than or equal to the maximum frequency rate value (condition 12) AND the n-th frequency acceleration calculation ($|d^2f_n/dt^2|$) is less than or equal to the maximum frequency acceleration (condition 14). The result of this first AND operation using conditions 12 and 14 as inputs is then provided as a first input to a logical OR operation, where the other input to the logical OR operation is the comparison of $df_n/dt$ to the maximum "normal conditions" frequency rate value (condition 16). If either condition 16 is true or both of conditions 12 and 14 are true, then n-th frequency calculation $f_n$ will be accepted as true (that is, as the correct power system frequency), if $f_n$ is within the range of $f_{min}$–$f_{max}$ (condition 18).

Using the exemplary power system parameters set forth in FIG. 1, values appropriate for the logic scheme of FIG. 2 can be determined as follows:

$f_{min}$=2 Hz $f_{max}$=90 Hz $|df/dt|_{max}$=20 Hz/second

The other values of interest ($df/dt|_{norm}$, $|d^2f_n/dt^2|_{max}$) are based upon power system characteristics. Testing has determined that appropriate values for these parameters are approximately 2–3 Hz and 3–5 Hz/s², respectively.

Figure 3:
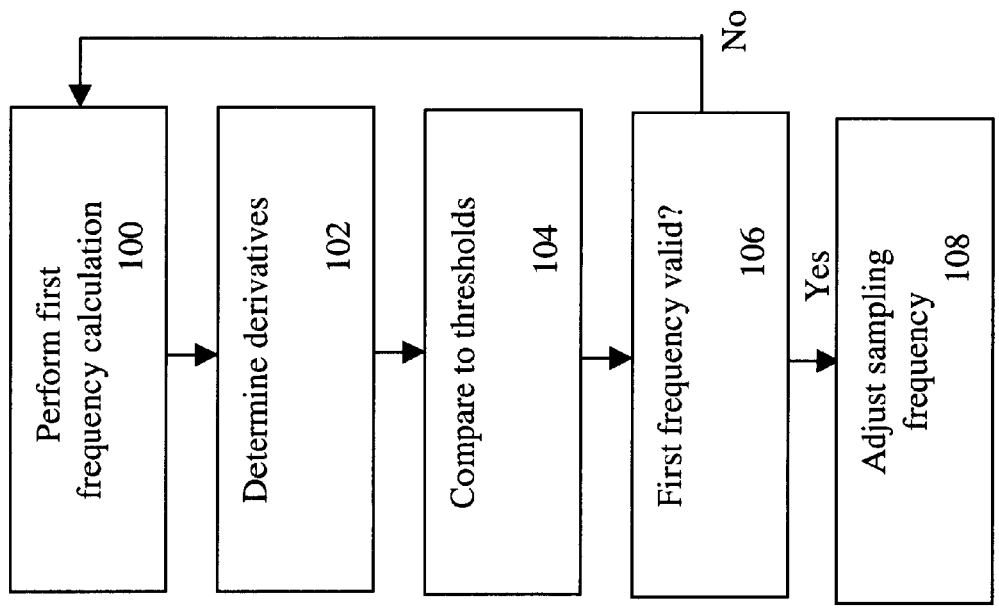
FIG. 3 is a flow chart representative of one method for implementing the present invention.

Referring now to FIG. 3, a flow chart describing a method for implementing the present invention is shown. The exemplary method can be implemented in a protective relay or other power control device having, or being operatively associated with, a suitably-programmed microprocessor, programmable logic, or circuitry. The example assumes that the appropriate maximum and minimum values have been determined for the power system. In step 100, a first frequency calculation is performed by the protective relay to determine the frequency of the power system. In step 102, first and second derivatives of the calculated frequency are determined. In step 104, comparisons to previously-determined threshold values are performed (e.g., by the microprocessor or other suitable comparison circuitry) to determine whether conditions 12, 14, or 16 exist. In step 106, it is determined whether the first frequency calculation is accepted as valid; that is, whether either condition 16 exists, or whether both conditions 12 and 14 exist, and whether the calculated frequency value is within the predefined range $f_{min}$–$f_{max}$. If it is determined in step 106 that the first frequency calculation is valid, then in step 108, the sampling frequency of the protective relay is adjusted as necessary to track the valid first frequency calculation. If it is determined in step 106 that the first frequency calculation is not valid, then the first frequency calculation is not accepted and the process is repeated.

Figure 4:
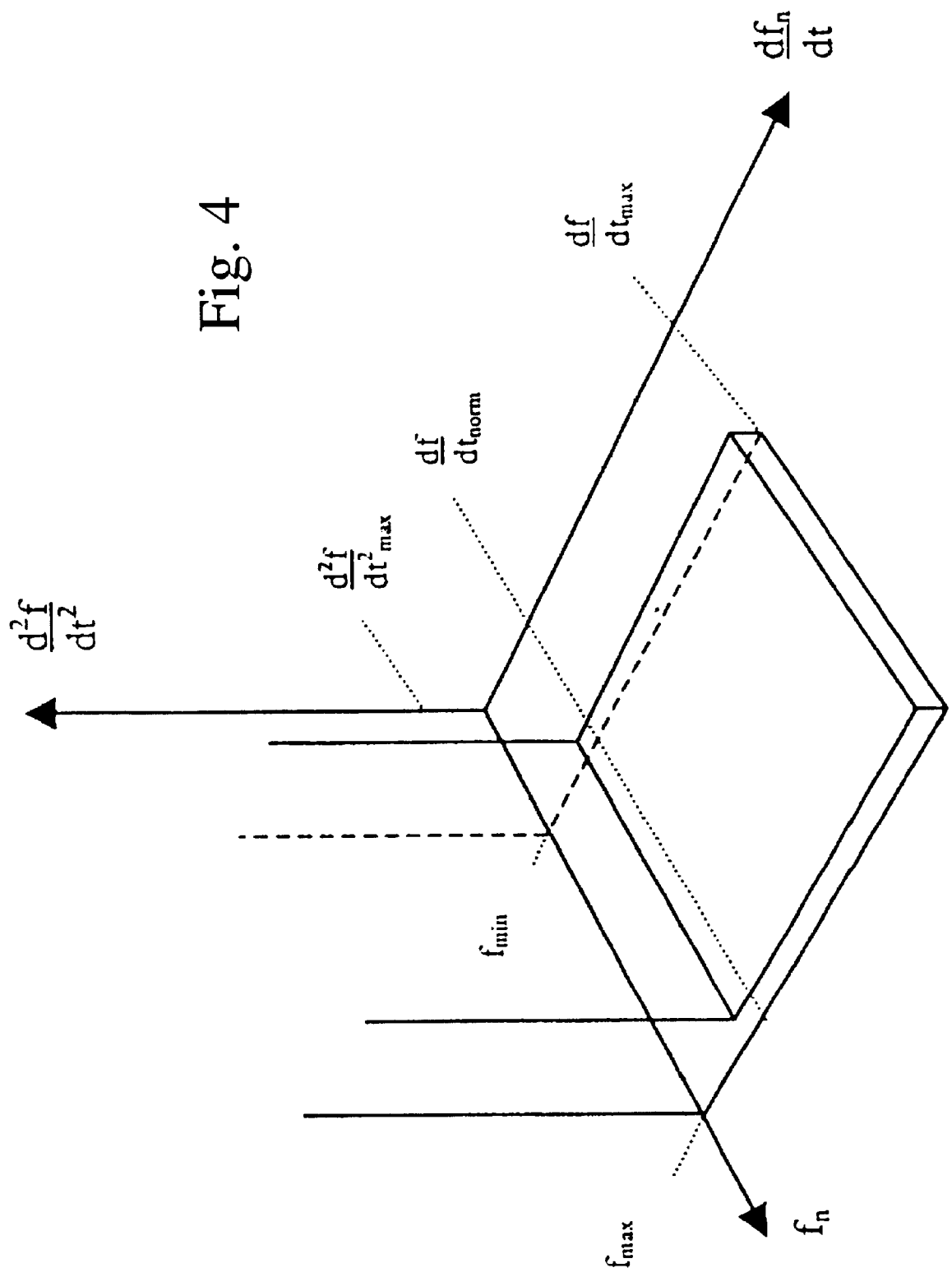
FIG. 4 is a signal space diagram showing the range of valid frequencies representing real frequency events according to one implementation of the present invention.

FIG. 4 depicts the signal space of valid signals representing real frequency events according to the present example. As reflected in the signal space diagram, signals accepted as representing real frequency events have a frequency within the range of $f_{min}$–$f_{max}$, and either have a first derivative (df/dt) less than the threshold value $df/dt|_{norm}$, or have both a first derivative less than the threshold value $df/dt|_{max}$, and a second derivative less than the threshold value $|d^2f_n/dt^2|_{max}$.

Figure 5:
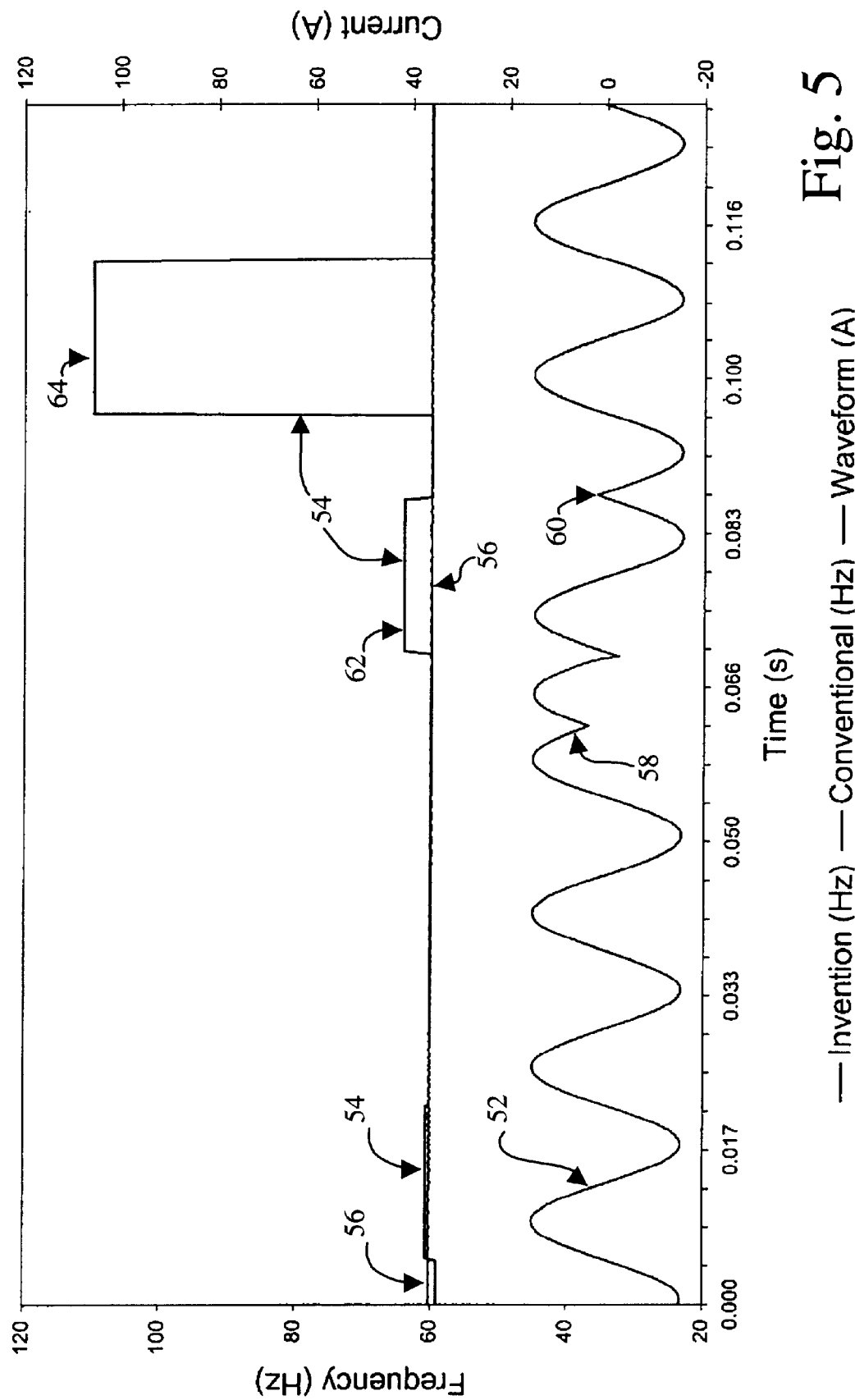
FIG. 5 is a comparison of the frequency tracking performance of a conventional technique versus an exemplary technique according to the present invention.

Referring now to FIG. 5, frequency plots showing the synchronization of the sampling rate of a protective relay to the power system frequency, using both an embodiment of the present invention and a conventional "averaging" method are provided. In FIG. 5, the power system frequency is represented by a waveform 52, the performance of the conventional "averaging" method is shown as bold waveform 54, and the performance of the embodiment of the present invention as a lighter-shaded, substantially constant line 56. It can be seen that the relay implementing the technique of the present invention provides greatly improved synchronization, and hence greatly improved accuracy of the Fourier transform calculations and greatly improved protective control capabilities of the protective relay. In particular, it can be seen in FIG. 5 that current reversals, such as those occurring at points 58 and 60, produce inaccuracies in the conventional frequency tracking scheme during time intervals 62 and 64, and that these inaccuracies are substantially reduced by the exemplary technique of the present invention.

Figure 6:
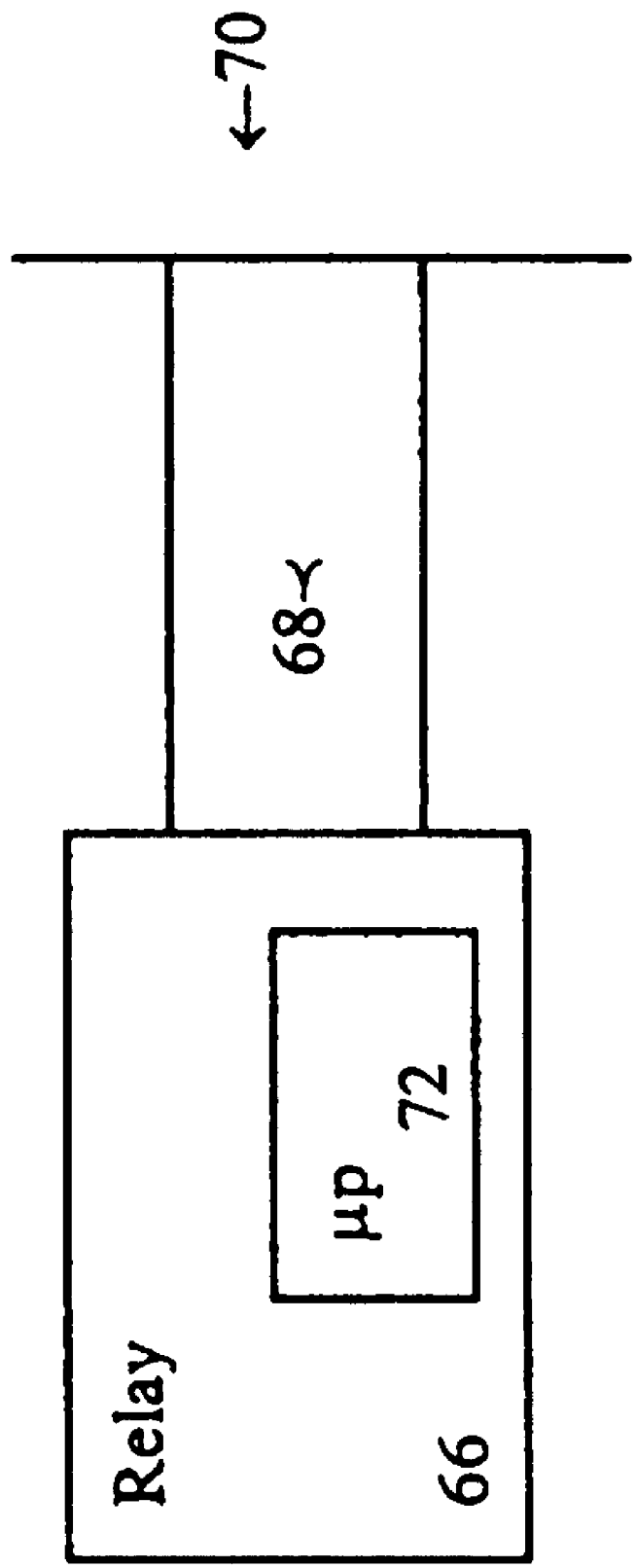
FIG. 6 is a block diagram of a protective relay suitable for implementing the present invention.

FIG. 6 shows a block diagram of a protective relay capable of implementing the present invention. The relay 66 includes connection ports 68 for connection to a power distribution system 70. Through the ports 68, the relay can sense system conditions (e.g., by sampling system data at a data sampling rate), and provide appropriate protective control if and when necessary. The relay 66 further includes a suitably-programmed microprocessor 72 which, in addition to performing conventional control functions, also adjusts the sampling frequency to the frequency of the power distribution system according, e.g., to the method described in the connection with FIG. 3 or other suitable method. In this matter, the microprocessor 72 constitutes an exemplary means for carrying out both protective control functions and frequency tracking functions.

While the foregoing description contains numerous details, it is to be understood that these are provided for purposes of explanation only, and that these details are not to be read as limitations of the present invention. The specific exemplary embodiments described above can be modified in many ways without departing from the spirit and scope of the invention, as defined by the following claims and their legal equivalents.

What is claimed is:

1. A method for adapting a sampling rate at which data is sampled in an electrical power system, to a frequency of the electrical power system, comprising the steps of:

performing a first frequency calculation to determine the frequency of the electrical power system;

determining first and second derivatives of the frequency of the electrical power system;

comparing the first and second derivatives to first and second maximum derivative values, respectively, and comparing the first derivative to a normal first derivative; and if the first derivative is less than the normal first derivative, or if both the first and second derivatives are lower than the first and second maximum derivatives, then accepting the first frequency calculation as true, and adapting the sampling rate based on the first frequency calculation.

2. The method of claim 1, wherein the first maximum derivative is approximately 20 Hz/second.

3. The method of claim 1, wherein the first frequency calculation is between approximately 2 Hz to 90 Hz.

4. The method of claim 1, wherein the normal first derivative is approximately 2 Hz/second to approximately 3 Hz/second.

5. The method of claim 1, wherein the maximum second derivative is approximately 3 Hz/second$^2$ to approximately 5 Hz/second$^2$.

6. A protective relay for providing protective control of power distribution system, comprising:

ports which are removably connectable to the power distribution system to sense power system conditions and to provide protective control; and at least one microprocessor operatively connected to the ports, the microprocessor programmed to sample power distribution system data at a data sampling frequency, to determine an operating frequency of the power distribution system, to calculate first and second derivatives of the operating frequency, to compare the calculated derivatives to threshold values, and to adjust the data sampling frequency based on the comparison, wherein the microprocessor compares the first and second derivatives to first and second maximum derivative values, respectively, and compares the first derivative to a normal first derivative, and adjusts the sampling frequency based on the comparisons.

7. The protective relay of claim 6, wherein the relay adjusts the sampling frequency if the first derivative is less than the normal first derivative, or if both the first and the second derivatives are lower than the first and second maximum derivatives, respectively.

8. The protective relay of claim 6, wherein the first maximum derivative is approximately 20 Hz/second.

9. The protective relay of claim 6, wherein the first frequency calculation is between approximately 2 Hz to 90 Hz.

10. The protective relay of claim 6, wherein the normal first derivative is approximately 2 Hz/second to approximately 3 Hz/second.

11. The protective relay of claim 6, wherein the maximum second derivative is approximately 3 Hz/second$^2$ to approximately 5 Hz/second$^2$.

12. A protective relay for providing protective control in a power distribution system, comprising:

connection means for connecting the relay to the power distribution system; and processing means for sensing system conditions through the connection means at a sampling frequency, for providing protective control based on system conditions through the connections means, and for adjusting the sampling frequency based on a comparison of first and second derivatives of an operating frequency of the power distribution system to threshold values, wherein the threshold values include first and second maximum derivative values and a normal first derivative value.

13. The protective relay of claim 12, wherein the first maximum derivative is approximately 20 Hz/second.

14. The protective relay of claim 12, wherein the first frequency calculation is between approximately 2 Hz to 90 Hz.

15. The protective relay of claim 12, wherein the normal first derivative is approximately 2 Hz/second to approximately 3 Hz/second.

16. The protective relay of claim 12, wherein the maximum second derivative is approximately 3 Hz/second$^2$ to approximately 5 Hz/second$^2$.

* * * * *